United States Patent [19]

Peeters

[11] 4,394,661
[45] Jul. 19, 1983

[54] RECORDING MATERIAL FOR STORAGE OF DIGITAL INFORMATION AND A RECORDING METHOD FOR STORAGE OF DIGITAL INFORMATION

[75] Inventor: Hugo K. Peeters, Mortsel, Belgium

[73] Assignee: Agfa-Gevaert, N.V., Mortsel, Belgium

[21] Appl. No.: 247,405

[22] Filed: Mar. 25, 1981

[30] Foreign Application Priority Data

Apr. 22, 1980 [GB] United Kingdom ................. 8013289

[51] Int. Cl.³ .......................................... G01D 15/34
[52] U.S. Cl. .................................. 346/1.1; 346/76 L; 346/135.1; 369/94; 430/945
[58] Field of Search .................... 346/135.1, 76 L, 1.1; 358/128.5, 128.6, 129, 130; 369/108, 109, 121, 275, 286, 94; 430/945

[56] References Cited

U.S. PATENT DOCUMENTS

| | | | |
|---|---|---|---|
| 3,181,170 | 4/1965 | Arin | 346/108 |
| 3,716,844 | 2/1973 | Brodsky | 346/135.1 X |
| 3,842,195 | 10/1974 | Takahashi | 346/76 L X |
| 3,902,010 | 8/1975 | Goshima | 346/108 X |
| 4,109,045 | 8/1978 | Goshima | 358/130 X |
| 4,145,758 | 3/1979 | Drexler | 365/127 X |
| 4,214,249 | 7/1980 | Kasai | 346/76 L |

Primary Examiner—Joseph W. Hartary
Attorney, Agent, or Firm—A. W. Breiner

[57] ABSTRACT

Recording material suitable for use in laser beam recording characterized in that said material comprises on the same side of a laser radiation-reflective support, including a support with laser radiation reflecting layer, two superimposed adjacent recording layers which can undergo on exposure instantly produced optical density changes responsive to irradiation with laser beams of different wavelength, the compositions of said layers being such that they have different radiation-sensitive characteristics permitting information-wise recording to take place in one layer without changing the optical density of the other layer to such a degree that laser beam read out of optical density information in one layer becomes impossible upon using laser beams of different wavelength for each recording layer.

16 Claims, 4 Drawing Figures

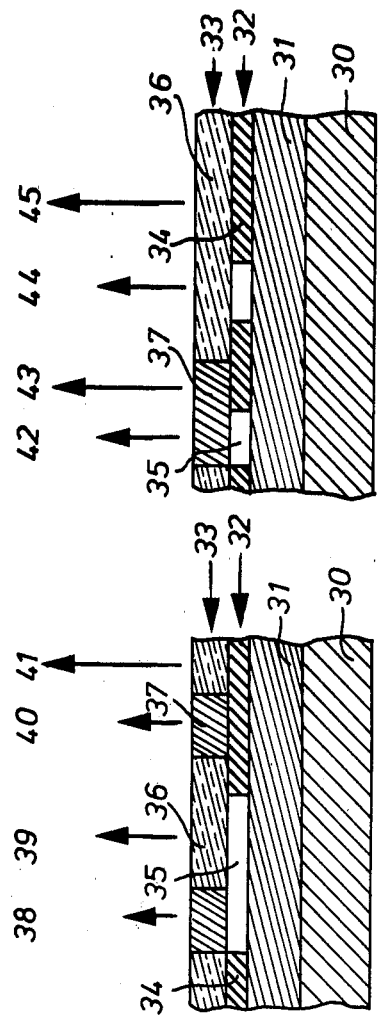

RECORDING MATERIAL FOR STORAGE OF DIGITAL INFORMATION AND A RECORDING METHOD FOR STORAGE OF DIGITAL INFORMATION

The present invention relates to a recording method suitable for storage of digital information and a recording material for use in said method.

It is known, e.g. from IEEE Spectrum August 1978, 20–28, to achieve high density storage of digital information by means of a modulated laser beam using a so-called optical disc.

Most of the present optical disc recording materials are characterized by a thermosensitive recording layer that makes possible direct recording and instant playback with laser beams. In use, said recording materials absorb energy from an on-off modulated laser beam which effects intense highly localized heating, whereby a meltable material, e.g. a thin metal layer, is locally melted or displaced or is caused to coalesce into microscopic globules (ref. the article of A. L. Harris et al "Continuous Wave Laser Recording on Metallic Thin Film," Journal of Image Technology, April/May (1970) p. 31–35). These optical disc recording materials are attractive because of their capability of storing encoded information at very high bit density, in principle up to $10^8$ bit/sq. cm (see Optical Acta, 1977, Vol. 24, No. 4, 427–431).

From the published Japanese Patent Application No. 73/43140 it is known to increase the potential data storage density by utilizing a transparent support having a coloured thermosensitive recording layer on each side thereof, each such layer being subject to detectable change responsive to heat generated therein by irradiation with a laser beam. One recording layer is e.g. green and the other recording layer red. A laser beam of a ruby laser emitting at a wavelength of 694 nm is absorbed in the green recording layer but substantially transmitted by the red recording layer, whereas a laser beam of an argon ion laser emitting at a wavelength of 514 nm is absorbed in the red recording layer and substantially transmitted by the green recording layer. The retrieval of information proceeds by transmission-exposure with two coloured light beams, one for each layer, so as to become substantially absorbed by the dye left in the corresponding recording layer.

According to the Japanese document it is impossible by this method to form individual colour patterns by using a recording material having two different colour layers on one side of the support, since the vapour produced on laser beam absorption in the underlying colour layer destroys by pressure the upper colour layer too.

From the U. K. patent specification No. 1,516,413 a multi-layered optical data record is known which record includes a base member having a first side and a second side separated by the thickness of said base member, and a plurality of optical data layers having optical data information spots recorded thereon as a plurality of spaced discrete data spots of variable size, said data layers including first and second data layers being contiguous so that corresponding surfaces of said layers are separated by a distance less than the thickness of said base member, and said first and second data layers each having complete data recorded thereon, so that only one data layer at a time is used to modulate readout light and thereby produce a readout signal of the data in said one layer. A recording material described for producing said record includes photographic film having a plurality of different colour emulsion layers. In order to form the record therewith there are effected multiple exposures of the film to different coloured light beams to form the data tracks on the different data layers by chemical development and processing carried out through the upper layers. Such material does not allow to produce in the recording step instantly produced optical density changes, in other words such material does not offer the possibility of direct-read-after write (DRAW) i.e. immediate playback after recording.

The present invention provides a recording material suitable for use in laser beam recording which material comprises on the same side of a laser radiation reflective support, including a support with laser radiation reflecting layer, two superimposed adjacent recording layers which can undergo on exposure instantly produced optical density changes responsive to irradiation with laser beams of different wavelength, the compositions of said layers being such that they have different radiation-sensitive characteristics permitting information-wise recording to take place in one layer without changing the optical density of the other layer to such a degree that laser beam read out of optical density information in one layer becomes impossible upon using laser beams of different wavelength for each recording layer.

Such material provides the possibility of higher data storage capacity and read back in the reflection mode whereby light-absorption differences are more pronounced than in transmission read back.

According to a preferred embodiment the recording material is characterized in that the recording layer nearest to the support is a thermosensitive recording layer capable of obtaining a physical change associated with a change in optical density by exposure with laser radiation and the other recording layer is a photosensitive recording layer that is capable of obtaining a colour or colour change through the photochemical action of laser radiation which includes visible light and/or ultraviolet radiation of such intensity that on striking first the photosensitive layer within its spectral sensitivity range the optical density of the thermosensitive layer can not be affected thereby, and the spectral sensitivity range of the photosensitive layer is such that the thermosensitive layer can be exposed selectively with laser radiation to modify its optical density without modifying the optical density of the photosensitive layer to such a degree that the selective read out of recorded information in each recording layer becomes impossible.

Preferably the colour obtainable by photochemical action in the photosensitive layer corresponds with a spectral absorption that still allows to strike and optically modify the thermosensitive layer with light of a wavelength not absorbed by the area that have obtained said colour in the photosensitive layer. The advantage of such system resides in the capability to modify the thermosensitive layer in area corresponding with information in the overlying photosensitive layer so that information can be piled up in congruent area rather than recorded in adjacent area of each layer.

The information-wise exposure of the photosensitive recording layer with a modulated laser beam preferably forms a pattern having a spectral absorption band different from the spectral absorption band of the pattern formed in the thermosensitive recording layer. The change in optical density in the thermosensitive recording layer is according to an embodiment a decrease in optical density e.g. due to ablative removal of a substance.

The present recording material is particularly suited for the recording of digital information e.g. for use as a video-disc.

By digital information is understood information in the form of discrete or discontinuously varying, i.e. pulse-wise varying, quanta of matter or energy, e.g. pulsed laser radiation.

The photosensitive and thermosensitive layer can be exposed in either order.

Simultaneous or successive exposure of congruent area of both recording layers is possible with two different laser beams through a single focusing device (lens or lens system) having a focusing depth covering both layers.

The present recording material is suitable for "add-on" recording, i.e. after an initial recording further digital information can be recorded in areas that have not been exposed before. Since the recording material is actually a print-out recording material it offers the possibility of direct-read-after-write (DRAW) i.e. immediate playback after recording.

The present recording material has a doubled storage capacity compared with a single layer recording material for information can be piled up in congruent area of the recording layers.

The present invention includes also a recording material having a duplitized structure i.e. recording material having a set of said recording layers on each side of the support.

The recording method of the present invention operates with information-wise modulated laser beams, and is characterized in that (1) information-wise modulated radiation of a first laser beam is focused onto one of the recording layers of the recording material as defined above while having a relative movement between said recording layer and the said first beam, the exposure with said first beam being of sufficient dose to produce instantly in said one recording layer a pattern of optical density differences, and (2) information-wise modulated laser radiation of a second laser beam is focused onto the other adjacent recording layer of the same recording material while having a relative movement between said recording layer and said second beam, the exposure of said second beam being of sufficient dose to produce instantly in said other recording layer a pattern of optical density differences, the exposure of each of the layers with each of the laser beams being such that they do not change the optical density of the other layer to such a degree that selective laser beam read out of optical density information in each layer becomes impossible upon using laser beams of different wavelength for each recording layer.

The recording method operating with the above preferred recording material including a thermosensitive and a photosensitive recording layer operates with information-wise pulsed laser beams and is characterized in that (1) information-wise pulsed radiation of a first laser beam is focused onto the thermosensitive recording layer of said recording material, while having a relative movement between said thermosensitive recording layer and the first laser beam, the exposure with said first beam being of sufficient dose to produce in said thermosensitive recording layer a pattern of a physical change associated with a change in optical density, and (2) information-wise pulsed laser radiation of a second laser beam is focused onto the photosensitive recording layer of the same recording material while having a relative movement between said photosensitive layer and said second laser beam whose laser radiation contains electromagnetic radiation of the visible and/or ultra-violet wavelength range in the spectral sensitivity range of the photosensitive layer, the exposure of the photosensitive recording layer being information-wise such that a detectable colour or colour change is formed therein without affecting the thermosensitive layer, the recording of information with the first laser beam in the thermosensitive recording layer being such that therein the optical density is modified without modifying the optical density of the photosensitive layer to such a degree that the selective read out of recorded information in each of the recording layers by using laser radiation of different wavelength becomes impossible.

As a modification of the above recording method only one of the laser beams is pulsed and the other laser beam exposes with constant intensity and records a non-digital i.e. continuous track in one of the recording layers, e.g. a continuous spiral track having over its course a constant optical density and optionally within the same spectral absorption band as the information pattern recorded in the other recording layer. Said track may serve as pre-recorded guide track for the same purposes as the pre-groove of a pre-grooved disc (ref. IEEE Spectrum August 1979, p. 26–32) i.e. for keeping the writing and likewise reading laser spot in the other recording layer in line with said track. A radial servo system controls with said pre-track as described in the last-mentioned IEEE Spectrum reference the radial tracking of the optical recording head during both reading and recording of digital information. In practice the continuous optical track produced in one recording layer, e.g. the photosensitive recording layer, may have a width of 0.6 $\mu$m.

The pre-track concept applied to the photosensitive layer can be extended further by superimposing a modulated optical density pattern in that track on the already obtained continuous optical density. That pattern may represent data serving as an address to locate recorded data in the thermosensitive recording layer. This can be done by dividing a spiral track into sectors and prerecording a heading in the photosensitive recording layer at the beginning of each sector. The heading contains information about the sector, e.g. the sector number, the kind of information stored (words or images, a code number for the topic) and information about the stored images, e.g. particulars about a recorded X-ray photograph of a patient.

The prerecorded information as well as the information recorded later on can be video, audio or data—or a combination of these in digital form. The retrieval of information proceeds with reflected light whereby density differences in each recording layer are added since light passes twice i.e. first through the recording layers towards the reflective element and secondly from the reflective element again through the recording layer(s) towards an electronic photon-detector.

The retrieval of recorded digital information in both the recording layers proceeds in the case that the density patterns have different spectral absorption characteristics with laser beam radiation of different wavelength for the thermosensitive and photosensitive recording layers to differentiate the optical density pattern in each of the layers. Such means that on recording different information in each of the recording layers and not simply a track of constant optical density in one of the recording layers, the resulting patterns should have a different spectral absorption. Such is not necessary when one of the recording layers only serves for track guidance of light in the other recording layer.

The following will deal more in detail with the structure and composition of recording materials according to the present invention and their use in the recording and retrieval of digital information.

Recording materials and the recording and retrieval of digital information according to the present invention are illustrated by the accompanying drawings.

FIG. 3 illustrates schematically a section of a recording material according to the present invention after recording and the relative values of light-reflection obtained with light of different wavelength in the readback of digital information stored in both recording layers.

Figure 1:
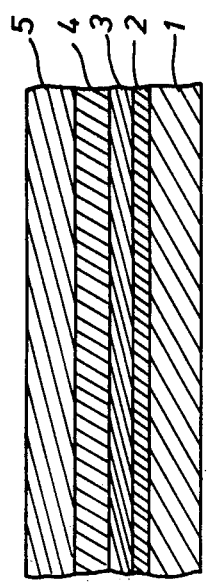
FIG. 1 illustrates schematically the structure of an embodiment of a bi-recording layer material of the present invention.

In FIG. 1 element 1 represents a substrate, e.g. resin or glass support, coated with a reflective layer 2, e.g. aluminium layer. On the reflective layer 2 a thermosensitive layer 3 for ablative recording is present which layer obtains a decrease in optical density when heated with absorbed laser light of a wavelength of at least 350 nm.

The thermosensitive layer 3 carries directly or optionally through the intermediary of an optically clear layer, e.g. serving as subbing layer or as heat-shielding layer (not shown in the drawing), a photosensitive layer 4 that is sensitive to laser radiation with a wavelength e.g. below 700 nm and obtains a change in optical density by exposure to said light, e.g. U.V. radiation in the wavelength range of 250 to 400 nm. A protective optically clear resin overcoat 5 of a thickness of e.g. 0.1 nm provides sufficient protection against abrasion and dust.

The optically clear protective overcoat 5 or cover layer preferably has a relatively large thickness with regard to the recording layers. Such provides the possibility of keeping dust, scratches, finger prints, etc. out of the focal plane when the recording layer(s) are exposed through focusing optics.

Suitable thermosensitive layers for ablative recording are metal layers. Particularly useful metals for producing such layers are Ti, Ge, Te, In, Pb and Bi or alloys thereof and are coated, e.g. by vacuum evaporation, in a thickness in the range of 5 to 80 nm. Such layers are described in Appl.Phys.Lett. 34, Feb. 15, 1979, p. 275–276.

These metal layers have a reasonably high absorbence for laser light with a wavelength above 350 nm. The recording of digital information in such layers proceeds with a laser beam that is modulated, e.g. pulsed, in accordance with a pattern of information and focused on the heat-sensitive recording layer. By the impinging radiation energy portions of the thermosensitive metal recording layer are coagulated in small discrete particles or pushed aside in molten state (ablated) so that such recording technique is usually called ablative recording. The laser beam energy dose for imaging on such metal layers is, e.g., in the range of $10^5$–$10^6$ mJ/sq.m whereby is meant that said energy per sq.m is sufficient to ablate these metal layers at scan velocities of e.g. 20–200 m/s with a focused beam radius of e.g. 25–40 $\mu$m.

To improve the thermal efficiency of the recording material between the thermosensitive layer and the reflective layer, which normally is a good heat conductor such as an aluminium layer, an optically clear layer with low heat conductivity such as a silicon dioxide layer may be applied between said layers.

Instead of using a metal layer that locally can be pushed away or coalesced by heat, a layer of meltable dye can be used likewise. A meltable dye suited for that purpose is described, e.g., in the U.S. Pat. No. 4,023,185.

Suitable photosensitive layers include in a binder a photosensitive substance capable of forming photoradicals and (a) dye precursor compound(s). Examples of such compositions are described by Eric Brinckman et al in Unconventional Imaging Processes—The Focal Press, London and New York (1978), p. 67–93. Particularly suitable photoradical-forming compounds are organic polyhalogen compounds.

Other suitable photosensitive layers include a dye that can be bleached photochemically as described, e.g., by Kosar in Light-Sensitive Systems—John Wiley & Sons Inc., New York (1965), p. 387–396.

In a first embodiment the photosensitive layer is a layer that obtains colouration by strong U.V. exposure but remains substantially unchanged by long duration exposure to U.V. and visible light. Photosensitive layers of that kind contain, e.g., as dye precursor a spiropyran and an organic polyhalogenated substance, which generate(s) photoradicals forming an acid by irradiation with laser beam U.V. radiation as described, e.g., in the French Patent Specification No. 2,371,710 and in Applied Optics, April 1974 Vol. 13, No. 4, p. 857–860. According to the latter reference the U.V. sensitivity of the photosensitive layer comprising as photosensitive organic polyhalogen compound tribromoethanol and a spiropyran compound as dye precursor is relatively high and an energy density (dose) of only 40 mJ/sq. cm independent of scan velocity at 257 nm wavelength is sufficient to get an optical density 1.0 in the visible light range.

In a second embodiment a photosensitive layer is used that is substantially more sensitive to U.V. radiation than the layer of the first embodiment but likewise is almost non-sensitive to visible light. In that case the photosensitive recording layer after being exposed to modulated laser U.V. radiation is shielded from further U.V. exposure with an U.V. absorbing means, e.g. a solvent-coated U.V. absorbing layer that is transparent to visible light and still allows readback of information present in the underlying layers.

Suitable U.V.-radiation-absorbing substances for use in an U.V. filter layer blocking further exposure to U.V. radiation are described, e.g., in the U.S. Pat. No. 3,849,658.

Photosensitive layers on the basis of dye precursors such as spiropyrans and which have improved sensitivity to U.V. radiation are described, e.g., in U.K. patent specification No. 1,359,472 and U.S. Pat. No. 3,817,752.

Because there is nearly no time delay (less than 100 ns) in the formation of the optical density change in the thermosensitive recording layer as well as in the photosensitive recording layer a control reading process is possible just during or immediately after the recording, i.e. DRAW: "direct read after write" is possible.

The optical density range in the photosensitive recording layer by means of dyes is a molecular process; therefore, the information can be recorded therein with a very high resolution. The ultimate spot size in the irradiated areas is defined by the diffraction-limited-focusing of the optical system, e.g. lenses, used.

In order to provide sufficient mechanical strength, the photosensitive layer contains preferably a film-forming resin binder composed of polymers and copolymers as described, e.g., in the U.S. Pat. No. 3,810,762 and in French Patent Specification No. 2,731,710.

Normally there is continuous relative motion between the laser beam spot and the recording layer so that as the laser is pulsed discrete pits or holes constitute information in digit form in the thermosensitive recording layer and discrete dye spots constitute information in digit form in the photosensitive layer. A digit is a unit of information numerically detectable as a binary zero or one by a detector with preset sensitivity.

Figure 2:
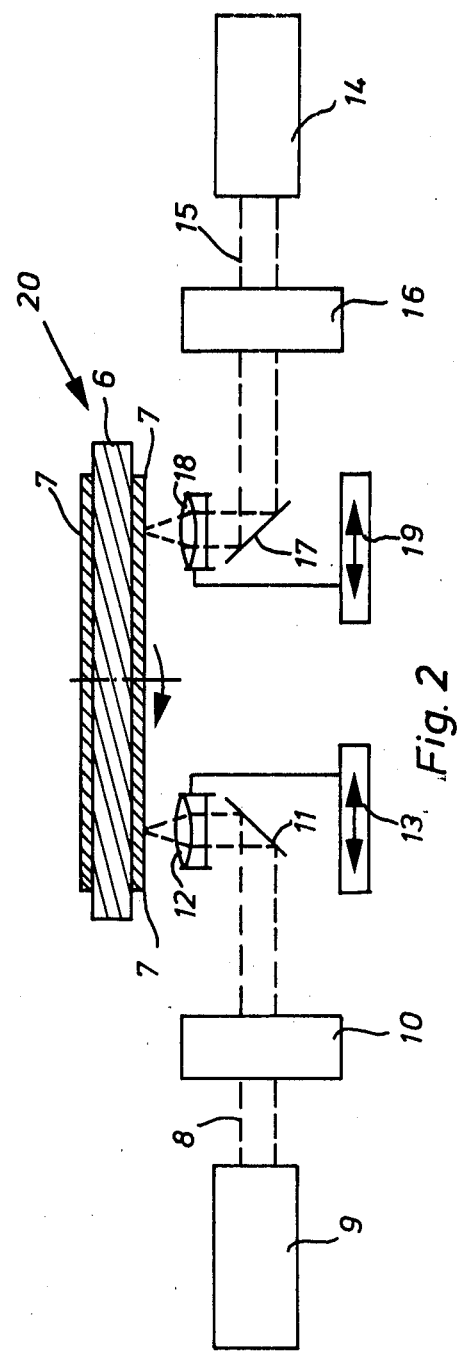
FIG. 2 illustrates in a block diagram an embodiment of digital information recording using a laser-beam-sensitive recording material of the present invention.

An embodiment of recording digital information with digit-wise modulated laser beams using a recording material according to the present invention is illustrated in a block diagram in FIG. 2. In that diagram the present recording material is applied in the form of a disc 20 that is rotatably mounted on a turntable (not shown in the drawing). The aluminium-coated glass or resin support 6 is coated on both sides with a multilayer structure 7. Said multilayer structure 7 comprises starting from the aluminium-coated support 6 a heat-shielding silicon dioxide layer as described in IEEE Spectrum, August 1978, p. 26, a thermosensitive tellurium layer as described in Appl.Phys.Lett. Vol. 34, No. 4, February 15, 1979. p. 276 for ablative recording, and a photosensitive recording layer containing a U.V.-sensitive polyhalogenated hydrocarbon, a spiropyran compound acting as pyrilium dye precursor and a binder as described in French Patent Specification No. 2,371,710, and an optically clear cover layer.

For such cover layer and its purpose reference is made, e.g., to the published German Patent Application DE-OS No. 2,817,945.

Onto the thermosensitive layer of said multilayer structure 7 a laser beam 8 generated by an AlGaAs laser diode 9 impinges light of a wavelength of 820 nm as described in IEEE Spectrum, August 1979, p. 30. For producing light pulses the light is intensity-modulated with an intensity switch 10, which may be a modulator of the drive current of the laser diode 9.

In that way light pulses with power of up to 20 mW for 50 ns can be generated.

The pulsed laser beam is deflected by a mirror 11 and focused by a lens 12 mounted on a positioning system 13, which can be moved radially back and forth.

Another laser 14, e.g. argon-ion laser having an emission at 514 nm, which by frequency doubling becomes 257 nm, is used to expose the photosensitive layer of the multilayer structure 7. The laser beam 15 is pulsed with an intensity switch 16 and directed with a mirror 17 and focusing lens 18 onto the photosensitive layer. A positioning system 19 moving in radial direction makes that a spiral track is formed.

In order to write digital information into the recording layers according to a certain sequence of binary "ones" and "zeroes" the light modulator of both lasers is switched sequentially into the corresponding "off" and "on" states during rotation of the disc 20, resulting in a sequence of clear spots (holes) in the thermosensitive recording layer and of yellow dye spots in the photosensitive recording layer when using as dye precursor the spiropyran compound 1′,3′,3′-trimethyl-spiro(2H-1-benzopyran-2′,2′-indoline) and tribromoethanol as acid-forming photoradical-producing compound.

In FIG. 3 a section of a preferred recording material according to the present invention after recording is represented and its absorption in the read back with reflected light of 454.5 nm wavelength (see part (A)) and with reflected light of 514 nm wavelength (see part (B)) is illustrated.

The recording material considered in said FIG. 3 is of the type wherein the thermosensitive layer has a higher reflectivity for visible light than the reflective element, which may be the support itself or a layer applied to the support, e.g. an aluminium layer. Here the thermosensitive recording layer has a reflectivity stronger than that of said reflective element and is e.g. a bismuth layer suitable for ablative recording. According to a particular embodiment the reflectivity of said reflective element with regard to laser radiation useful in read back is maximum 50% of the reflectivity of the thermosensitive recording layer. The reflectivity of the reflective element, e.g. an aluminium layer, can be easily controlled by vapour deposition under reduced pressure and adapting layer thickness.

In said FIG. 3 element 30 is a resin or glass support coated with a rather poorly reflecting aluminium layer 31. Element 32 is a visible light-reflective thermosensitive bismuth layer containing area 34 of non-affected bismuth and holes 35 formed by ablative recording into the bismuth layer.

The aluminium layer 31 has been vapour deposited in such a way that its reflection power for light of 454.5 nm and 514 nm wavelength is not higher than 50% of the reflection power of the vapour deposited bismuth layer 32.

Element 33 is a photosensitive recording layer containing yellow dye spots 37 in an optically clear field 36. An optically clear cover layer applied to the photosensitive layer is not shown in the drawing.

Onto the recording layer sandwich in part (A) of FIG. 3 a spot of laser light of 454.4 nm impinges scanning-wise. The reflected laser beam light is represented by arrows 38, 39, 40 and 41 and the length of these arrows gives an idea of the intensity of the reflected light in the different areas of the recording material. The reflected light corresponding with arrow 41 is taken as reference value and has been given arbitrarily the value 100. The response-sensitivity of an electronic photodetector (not shown in the drawing) is set at a threshold value such that the reflected light corresponding with the arrows 38 and 40 results in a "zero" and the intensity of the light corresponding with the arrows 39 and 41 results in a "one". In this way the scanning 454.5 nm laser light spot provides a digital electronic output corresponding with the information stored in the photosensitive recording layer.

Onto the recording layer sandwich in part (B) of FIG. 3 a spot of laser light of 514 nm impinges scanning-wise. The intensity of the reflected laser beam light is represented by the arrows 42, 43, 44 and 45. The response-sensitivity of the photodetector (not shown in the drawing) used for detecting that light and converting it in an electrical signal is set at a threshold value such that the reflected light corresponding with the arrows 42 and 44 results in a "zero" and the intensity of the light corresponding with the arrows 43 and 45 (comparison value 100) results in a "one". In this way the scanning 514 nm laser light spot provides a digital electronic output corresponding with the information stored in the thermosensitive recording layer.

In the following Table several relative reflection values of the aluminium layer (% reflection) with respect to the thermosensitive layer are given for both laser beams. In combination therewith selected blue light optical densities and the corresponding transmission values after reflection (double pass) through the photosensitive layer at the yellow spot sites are given.

The percentage of reflected light in the area corresponding with the arrows 38, 39, 40, 41 and 42, 43, 44, 45 for combinations I, II, III and IV is given at wavelengths 454.4 nm and 514 nm respectively. The area corresponding with the arrows 41 and 45 have been given arbitrarily the reflection values 100 with respect to light of 454.5 nm and 514 nm wavelength respectively.

TABLE

| | | Combinations | | | |
|---|---|---|---|---|---|
| | | I | II | III | IV |
| % reflection of the aluminium layer with respect to the thermosensitive layer | | 50% | 30% | 20% | 10% |
| image density at 454.5 nm in the photosensitive layer | | 0.3 | 0.5 | 0.7 | 1.0 |
| corresponding % of transmitted light after reflection (double pass) | | 25 | 10 | 4 | 1 |
| | area of: | | | | |
| percentage of reflection at 454.5 nm | arrow 41 | 100 | 100 | 100 | 100 |
| | arrow 40 | 25 | 10 | 4 | 1 |
| | arrow 39 | 50 | 30 | 20 | 10 |
| | arrow 38 | 12.5 | 3 | 0.8 | 0.1 |
| percentage of reflection at 514 nm | arrow 45 | 100 | 100 | 100 | 100 |
| | arrow 44 | 50 | 30 | 20 | 10 |
| | arrow 43 | 100 | 100 | 100 | 100 |
| | arrow 42 | 50 | 30 | 20 | 10 |

From the above table can be derived that the minimal reflection ratios between the reflections in the areas corresponding with the arrows 40 and 39 and likewise in the areas corresponding with the arrows 44 and 45 are ½, ⅓, 1/5 and 1/10 respectively. These ratios should be taken into account in each individual case for choosing the detection selectivity of the photodetector.

We claim:

1. Recording material suitable for use in laser beam recording, which material comprises on the same side of a laser radiation-reflective support, including a support with laser radiation reflecting layer, two superimposed adjacent recording layers which can undergo on exposure instantly produced optical density changes responsive to irradiation with laser beams of different wavelength, the compositions of said layers being such that they have different radiation-sensitive characteristics permitting information-wise recording to take place in one layer without changing the optical density of the other layer to such a degree that laser beam read out of optical density information in one layer becomes impossible upon using laser beams of different wavelength for each recording layer, characterized in that the recording layer nearest to the support is a thermosensitive recording layer capable of obtaining a physical change associated with a change in optical density by exposure with laser radiation, and the other recording layer is photosensitive recording layer that is capable of obtaining a colour or colour change through the photochemical action of laser radiation which includes visible light and/or ultra-violet radiation of such intensity that on striking first the photosensitive layer within its spectral sensitivity range the optical density of the thermosensitive layer cannot be affected thereby, and the spectral sensitivity range of the photosensitive layer is such that the thermosensitive layer can be exposed selectively with laser radiation to modify its optical density without modifying the optical density of the photosensitive layer to such a degree that the selective read out of recorded information in each recording layer becomes impossible.

2. A recording material according to claim 1, wherein the colour obtainable by photochemical action in the photosensitive layer corresponds with a spectral absorption that still allows to strike and optically modify the thermosensitive recording layer with light of a wavelength not substantially absorbed by the area that have obtained said colour in the photosensitive recording layer.

3. A recording material according to claim 1, wherein the support is a resin or glass support coated with a reflective aluminium layer, the thermosensitive recording layer is a metal layer with a thickness in the range of 5 to 80 nm and is suited for ablative recording, and the photosensitive recording layer includes in a binder (a) dye precursor(s) and a photochemical substance capable of forming photoradicals.

4. A recording material according to claim 3, wherein the metal layer consists of one of the metals Ti, Ge, Te, In, Pb, and Bi or alloys thereof that are applied by vacuum evaporation.

5. A recording material according to claim 3, wherein the photosensitive layer contains as photoradical-forming substance an organic polyhalogen compound.

6. A recording material according to claim 3, wherein the dye precursor is a spiropyran.

7. A recording material according to claim 6, wherein the spiropyran forms a yellow dye.

8. A recording material according to claim 1, wherein the laser radiation reflective support has a reflectivity for laser light useful in read back of maximum 50% of the reflectivity of the thermosensitive recording layer.

9. A recording material accrding to claim 8, wherein the reflective support has a laser radiation reflective aluminium layer.

10. A recording material according to claim 1, wherein the recording material has a set of said recording layers at each side of the support.

11. Recording method operating with information-wise modulated laser beams comprising the steps of
(1) information-wise pulsed irradiation with a first laser beam of a recording material comprising on the same side of a laser radiation-reflective support, including a support with laser radiation reflecting layer, two superimposed adjacent recording layers which can undergo on exposure instantly produced optical density changes responsive to irradiation with laser beams of different wavelength, the compositions of said layers being such that they have different radiation-sensitive characteristics permitting information-wise recording to take place in one layer without changing the optical density of the other layer to such a degree that laser beam read out of optical density information in one layer becomes impossible upon using laser beams of different wavelength for each recording layer, wherein said first beam is focused onto a thermosensitive recording layer of said recording material, while having a relative movement between said thermosensitive recording layer and said beam, the exposure with said first beam being of sufficient dose to produce in said thermosensitive recording layer a pattern of a physical change associated with a change in optical density, and (2) information-wise pulsed laser irradiation of said recording material with a second laser beam which beam is focused onto a photosensitive recording layer of said recording material while having a relative movement between said photosensitive layer and said second laser beam whose laser radiation contains electromagnetic radiation of the visible and/or ultraviolet wavelength range in the spectral sensitivity range of the photosensitive layer, the exposure of the photosensitive recording layer being information-wise such that a detectable colour or colour change is formed therein without affecting the thermosensitive layer, the recording of information with the first laser beam in the thermosensitive recording layer being such that therein the optical density is modified without modifying the optical density of the photosensitive layer in such a degree that the selective laser beam read out of recorded information in each of the recording layers by using laser radiation of different wavelength becomes impossible.

12. A method according to claim 11, wherein the photosensitive recording layer is exposed first and the colour formed therein does not prohibit the exposure of the thermosensitive recording layer by said radiation of the first laser beam.

13. A method according to claim 11, wherein the thermosensitive recording layer is exposed prior to the photosensitive recording layer.

14. A method according to claim 11, wherein the exposure of the recording material with said first and second laser beam proceeds simultaneously.

15. A method according to claim 11, modified in that the exposure of the photosensitive recording layer proceeds with a laser beam exposing with constant intensity to form a continuous spiral track having over its course a substantially constant optical density.

16. A method according to claim 15, wherein in the photosensitive recording layer superposed to the track an optical density pattern is formed, which represents data serving as an address to locate recorded data in the thermosensitive recording layer.

* * * * *